US 8,698,665 B2

(12) United States Patent
Bollenbeck et al.

(10) Patent No.: US 8,698,665 B2
(45) Date of Patent: Apr. 15, 2014

(54) CONVERTING AND TRANSMITTING A MAGNETIC RESONANCE DETECTION SIGNAL

(75) Inventors: Jan Bollenbeck, Eggolsheim (DE);
Stefan Schwarzer, Taufkirchen (DE);
Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 13/525,186

(22) Filed: Jun. 15, 2012

(65) Prior Publication Data

US 2012/0319884 A1    Dec. 20, 2012

(30) Foreign Application Priority Data

Jun. 17, 2011   (DE) .......................... 10 2011 077 745

(51) Int. Cl.
*H03M 1/12*         (2006.01)
(52) U.S. Cl.
USPC .......................................... 341/155; 341/139
(58) Field of Classification Search
USPC ..................... 341/155, 139; 324/309, 307
See application file for complete search history.

(56) References Cited

U.S. PATENT DOCUMENTS

| 6,333,707 | B1 * | 12/2001 | Oberhammer et al. ....... 341/155 |
| 6,448,770 | B1 * | 9/2002 | Liu et al. ....................... 324/307 |
| 6,621,433 | B1 | 9/2003 | Hertz |
| 2008/0164879 | A1 | 7/2008 | Bollenbeck |
| 2009/0267601 | A1 | 10/2009 | Van Helvoort et al. |

FOREIGN PATENT DOCUMENTS

| DE | 10 2007 001 299 A1 | 7/2008 |
| WO | WO 2006/048816 A1 | 5/2006 |

OTHER PUBLICATIONS

German Office Action dated Mar. 20, 2012 for corresponding German Patent Application No. DE 10 2011 077 745.8 with English translation.

* cited by examiner

*Primary Examiner* — Jean B Jeanglaude
(74) *Attorney, Agent, or Firm* — Lempia Summerfield Katz LLC

(57) ABSTRACT

A system and method for converting an analog detection signal of a magnetic resonance detection coil into a digital detection signal and for transmitting the detection signal to an evaluating device. In an embodiment, the detection signal is digitized by an analog-to-digital converter, decimated by a decimation filter, transmitted through a transmission route, then equalized by an equalizing filter.

20 Claims, 4 Drawing Sheets

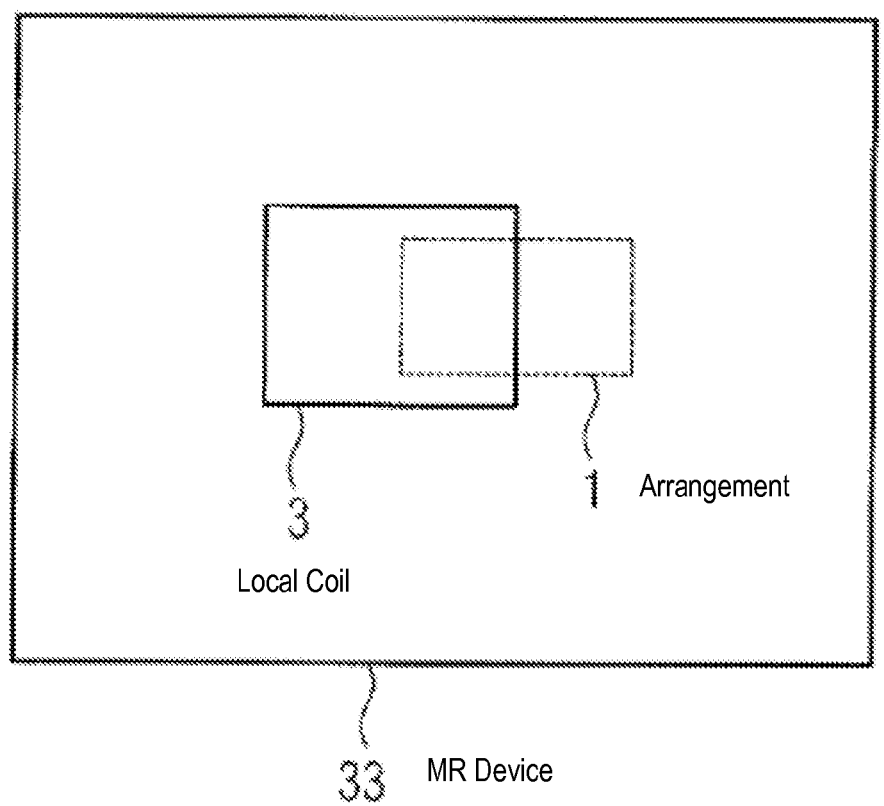

CONVERTING AND TRANSMITTING A MAGNETIC RESONANCE DETECTION SIGNAL

This application claims the benefit of DE 10 2011 077 745.8, filed Jun. 17, 2011.

BACKGROUND

The present embodiments relate to an arrangement for converting an analog detection signal from a magnetic resonance detection coil into a digital detection signal.

In magnetic resonance devices, local coils may also be used as detection coils. Such local coils transfer the detection signals to an evaluating device of the magnetic resonance device, where the signals are to be further processed by digital signal processing (DSP). Since the analog detection signals of the detection coil lie at the magnetic resonance frequency and are to be transported undistorted through the magnetic fields of the magnetic resonance device and through components of the magnetic resonance device without causing interference, coaxial cables with sheath current filters are used in order to transfer the detection signals to the evaluating device, where the signals are digitized and further processed.

WO 2006/048816 A1 discloses that the conversion of analog detection signals into digital detection signals may be carried out directly at the detection coil. For this purpose, an analog-to-digital converter is used. The analog-to-digital converter is arranged spatially within a detection region of the detection coil. In this way, bulky and costly coaxial cables are dispensed with. Active detection elements may be selected in the digital domain, so that analog switching electronics may advantageously be dispensed with. This also simplifies the use of the local coils.

One problem that arises with the corresponding embodiment of a conversion and transmission arrangement of this type is the digital signal transmission from the detection coil to a digital receiver of the evaluating device. The overall data rate used is proportional to the product of the signal bandwidth, the channel count and the logarithm of the signal dynamic range. These properties are limited by the available data rate of the transmission technology used.

The frequency bandwidth of the magnetic resonance signal is determined by the maximum gradient and object size. The bandwidth may reach an order of magnitude of approximately 1 MHz. In theory, it would thus be sufficient to use a sampling rate of 2 MS/s. However, in order to simplify the requirements placed on the prefilter for preventing noise-related aliasing, a sampling rate of, for example, 10 MS/s is used at the analog-to-digital converter.

In order to achieve the best possible signal to noise ratio (SNR) and the fastest measuring speed, the magnetic resonance signal may be detected with an array of a plurality of individual detection antennae of a detection coil, and processed simultaneously. For example, 128 active channels may be operated in parallel.

The signal dynamic range to be processed at an input of the signal chain (e.g., at the detection coil) extends from the thermal noise floor from the object being detected (e.g., a patient (−174 dBm/Hz)) up to a maximum level of approximately −20 dBm in a magnetic resonance device having a basic field strength of 3 Tesla. So that rounding errors in the digital transmission of the background noise does not increase significantly, at a sampling rate of, for example, 10 MS/s, a word size of approximately 18 bits is used.

This results, in this example, in a total data rate of 18*128*10 Mbit/s=23 Gbit/s. This represents an obstacle for the realization of wireless (e.g., radio) data transmission between the detection coil and the evaluating device.

Ways to reduce the transmission rate are being sought. A sampling rate of 2 MS/s is theoretically sufficient to be able to image the 1 MHz bandwidth magnetic resonance signal (e.g., the useful signal) without loss. German application DE 10 2011 006578.4 proposed that the digitized detection signal should initially be decimated to the lowest possible data rate. This is undertaken only after conversion into a digital detection signal by the analog-to-digital converter, since the useful dynamic range of the analog-to-digital converter in logarithmic representation behaves proportionally to the sampling rate. Thus, for example, at a sampling rate of 5 MS/s, the available dynamic range is three decibels lower than at 10 MS/s. In addition to this, given a severe reduction in the sampling rate of the analog-to-digital converter (ADC); a halved rate of 5 MS/s), the demands made on the analog filter may be met with extreme difficulty or not at all. For example, the useful signal from the detected signal downmixed to an intermediate frequency lies at 1.8+/−0.5 MHz. In that case, the "roll-off" (e.g., the step in the frequency response between the pass band and the stop band; at −40 dB) is achieved at between 2.3 MHz and 2.7 MHz, where the first aliasing band would occur. This requirement may not be achievable, with the result that decimation of the digitized detection signal to a lower sampling rate by a decimation filter is proposed. However, the requirements exist. For example, with the roll-off at 2.3 MHz-2.7 MHz, the filter portion of the digital decimation filter suppresses alias bands and noise aliasing. These requirements increase strongly as the degree of decimation rises. Therefore, an ever more complex filter with an increasing number of adders, subtractors (e.g., in cascaded integrator-comb filters (CIC)) and multipliers (e.g., in the general form of finite impulse response (FIR) filters) is provided. Taking account of the available FGPA resources and, above all, the energy utilization, the limits of feasibility are quickly reached. Added hereto is that, with regard to the emission of interference signals, the smallest possible number of digital operations close to the magnetic resonance detection antennae of the detection coil is a goal.

SUMMARY AND DESCRIPTION

In the conversion of magnetic resonance signals, there is a need to provide a conversion and transmission arrangement that reduces a data rate to be transmitted via a transmission route without placing excessive demands on a decimation filter at the detection coil. The present embodiments may obviate one or more of the drawbacks or limitations in the related art. For example, in an embodiment, the digitized detection signal is decimated within the detection coil by a decimation filter to a second sampling frequency and is transmitted via a transmission route to the evaluating device. The filter portion of the decimation filter has a frequency response that has a ripple content in the pass band associated with the useful signal of the digitized detection signal that is greater than 1 dB. Following the transmission route, an equalizing filter is provided. The frequency response of the equalizing filter corresponds, at least in the pass band associated with the useful signal, to the inverse frequency response of the filter portion of the decimation filter.

In another embodiment, the decimation filter function is divided up by using a decimation filter in the detection coil and an equalizing filter in the evaluating device, and thus, in the digital signal processing (DSP) block. A deliberately severe frequency response is permitted for the decimation filter in order to reduce the requirements on a filter portion of the decimation filter. The frequency response is subsequently compensated for in the equalizing filter. The demands placed on the filter portion of the decimation filter in the detection coil, which advantageously is a local coil, may thus be greatly reduced. FGPA resources are therefore spared, and both the energy consumption and the interference emissions at the detection coil are reduced without loss of signal quality. The additionally incurred energy consumption for the equalizing filter in the evaluating device (e.g., on the detection side of the transmission route) plays no part. High output FGPAs using a relatively large space may be used, since only minor space limitations apply.

A manipulated variable for determining the effort needed for realizing a filter is the ripple content in the frequency response in the region of the pass band. Typical requirements in order to avoid corrupting a signal too severely allow deviations in the signal damping in the pass band of up to a maximum of one decibel (e.g., +/−0.5 dB). Since at the desired target sampling rates for transmission the stop band is to follow immediately after the useful signal, large demands are being made if low ripple in the pass band and a specific roll-off of, for example, at least −40 dB to the stop band are both to be realized. According to an embodiment, increased ripple is permitted for the damping in the pass band, which may subsequently be corrected with the equalizing filter following the transmission route. A greater effort may be made without difficulty following the transmission route. For example, a greater ripple content (e.g., greater than one decibel, greater than 5 dB, or 12 dB) may be allowed at least in the region of the useful signal, but possibly also across the whole pass band. By this broadening of the pass band tolerance region, the effort necessary for realizing the filtration may be significantly reduced. For example, the abrupt transition from a flat pass band to the steep transition region may be softened.

In one embodiment, in order to obtain a pre-defined minimum filter damping difference (e.g., −40 dB) between the pass band and the stop band, the damping in the stop band is increased according to the increase in the ripple content. Therefore, if a requirement is placed on the transition region of, for example, −40 dB roll-off, a corresponding expansion of the signal dynamic range is provided. The word size of the decimated detection signal is increased according to the increase in the dynamic range of the frequency response as compared with the word size of the digitized detection signal (e.g., by 2 bits) given a ripple content of 12 dB. In order to be able to process the detection signal without any loss of dynamic range in the decimation stage of the decimation filter, the resolution may be increased according to the frequency response conceded. A ripple content in the pass band of 12 dB may be allowed, since this corresponds exactly to a broadening of the data word by 2 bits.

Considering an embodiment where the sampling rate in the analog-to-digital converter is 10 MS/s, and the word width is 18 bits, the data rate used on the transmission route that remains on a single channel may therefore be reduced by the decimation from 180 Mbit/s to (18 bits+2 bits)*5 MS/s=100 Mbit/s without large demands being placed on the filter portion of the decimation filter.

In another embodiment, a $20^{th}$-order FIR equiripple filter with a ripple content of 16 dB may be used as the decimation filter. The pass band ends at 2.3 MHz, and the stop band begins at 2.7 MHz. If the raised permitted ripple content is used to integrate part of the transmission range between the pass band and the stop band into the pass band, a less sharp transition may be used. For example, a $22^{nd}$-order FIR equiripple filter with a nominal ripple content of 0.5 dB, the nominal pass band of which ends at 1.8 MHz and the stop band of which begins at 2.7 MHz, may be used. If for this purpose, the end of the pass band is defined as being at 2.3 MHz, then a damping of −12 dB may be achieved at this point (e.g., according to the maximum allowed ripple content). This deviation may, however, be corrected again later with the equalizing filter. The filter arrangement may be approximately halved, so that the quantity of resources used in the FGPA is approximately halved.

The detection signal may be brought to an intermediate frequency before digitization. For this purpose, the analog-to-digital converter may be provided with a mixer for mixing the analog detection signal with a local oscillator frequency such that the useful signal comes to lie at an intermediate frequency. If, for example, a magnetic resonance device with a basic field strength of 3 Tesla is assumed, the magnetic resonance detection signal lies at a frequency of 123.2 MHz. By mixing with a 125 MHz Local oscillator frequency signal, the detection signal may be converted to an intermediate frequency of 1.8 MHz+/−500 kHz. A mirror filter may connect upstream of the mixer, and/or an anti-aliasing filter may connect downstream of the mixer. A mirror filter serves the purpose of preventing unwanted mixing product in advance. A subsequent analog anti-aliasing filter prevents noise from the aliasing bands of the sampling being able to be included. In the example described of the 3 tesla magnetic resonance device described, the closest aliasing band is located, for example, at 8.2 MHz+/−500 kHz, so that the stop band of the anti-aliasing filter may begin at 7.7 MHz.

The transmission route may include a radio link, an optical waveguide, and/or a transmission conductor line. Wireless, wire-bound, and optical transmission routes may also be used. The lower data rate achievable in the context of the present embodiments has the effect that there is greater flexibility with regard to the design of the transmission route.

In another embodiment, a serializer is connected upstream of the transmission route, and a deserializer is connected downstream of the transmission route. The signal is thus transmitted in a serial manner before being parallelized again.

Another embodiment relates to a magnetic resonance device with an arrangement of this type. All that has been described regarding previous embodiments may be applied similarly to embodiments involving a magnetic resonance device, so that the described advantages may also be achieved therewith.

For example, the detection coil is a local coil. This has already been described in relation to the arrangement. Specifically, in the case of local coils, the problem often exists that the coils are to be mobile and that the transmission of data and also energy, for example, to the local coil is to be provided. The present embodiment provides a contribution to achieving the planned entirely cable-free local coils, in that energy may be transmitted without cables. By lowering the data rate used for the transmission route, the route may also be realized at least partially as a radio route.

BRIEF DESCRIPTION OF THE DRAWINGS

FIG. 6 shows an embodiment of a magnetic resonance device.

DETAILED DESCRIPTION OF THE DRAWINGS

Figure 1:
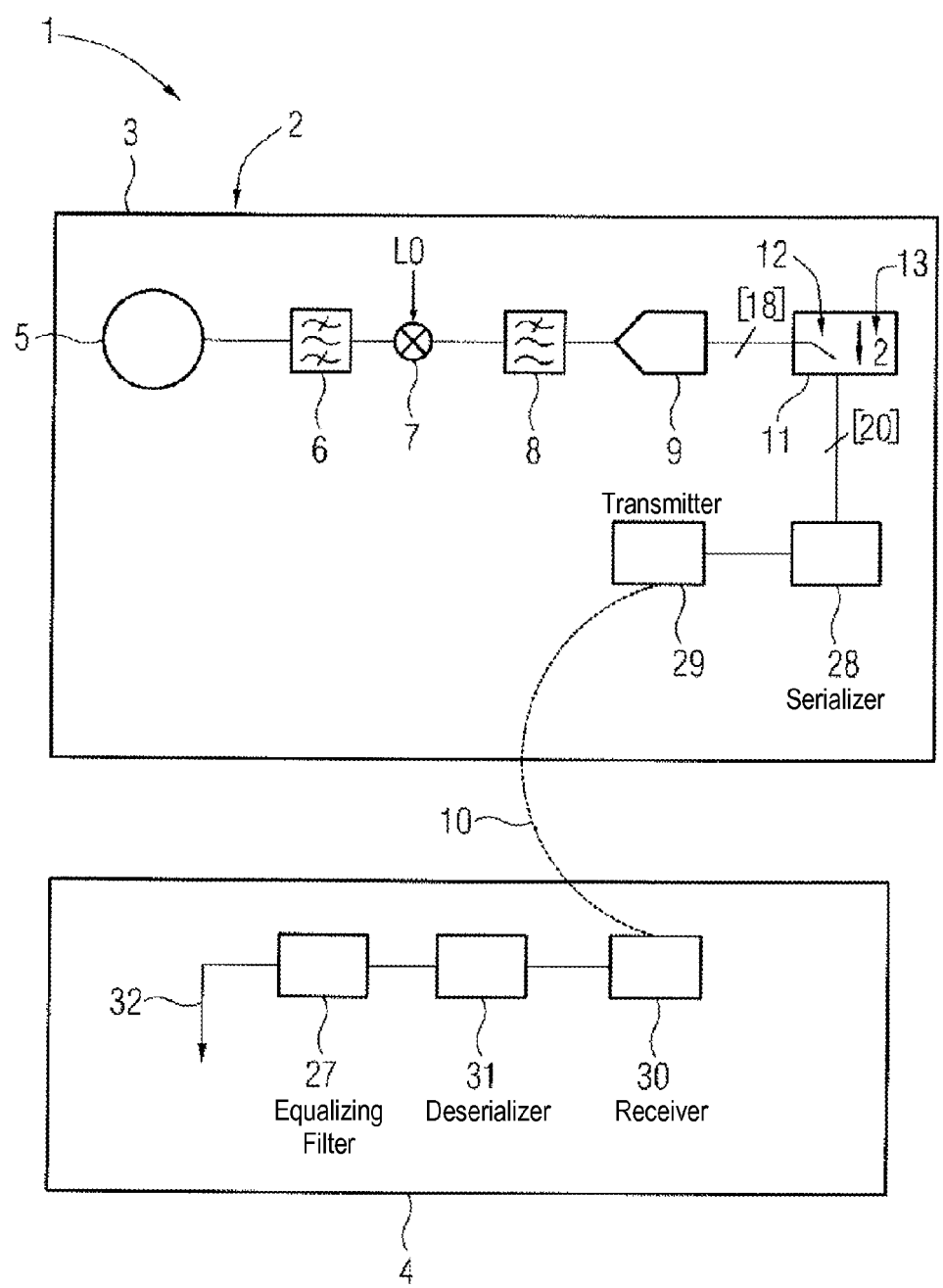
FIG. 1 shows an arrangement according to an embodiment.

FIG. 1 shows an arrangement 1 of an embodiment for converting an analog detection signal of a magnetic resonance detection coil 2 that, for example, is configured as a local coil 3, into a digital detection signal and for transmitting the detection signal to an evaluating device 4. The detection coil 2 has at least one detection antenna 5 (e.g., a plurality of detection antennae; conductor loops). The analog detection signal is converted by the arrangement 1 and is transmitted to the evaluating device 4. For this purpose, the analog detection signal is initially fed to a mirror filter 6 connected upstream of a mixer 7 in order to prevent interference (e.g., from noise) entering the mixing product. The mirror filter 6 is configured, for example, as a bandpass filter.

In the present embodiment, a magnetic resonance device, the basic magnetic field strength of which is 3 tesla is provided. The useful signal (e.g., the actual magnetic resonance signal) lies at 123.2 MHz+/−500 kHz. In the mixer 7, a local oscillator frequency LO (e.g., at 125 MHz) is used in order to bring the useful signal of the analog detection signal to an intermediate frequency (e.g., 1.8 MHz+/−500 kHz). The analog detection frequency brought thus to the intermediate frequency is passed to an aliasing filter 8. The aliasing filter 8, for example, is a low-pass filter that cuts off portions (e.g., aliasing bands) of the detection signal that may lead to aliasing during the subsequent digitization of the detection signal. Since the sampling in the subsequent analog-to-digital converter 9 (ADC) is carried out at 10 MS/s, in the present embodiment, the stop band of the aliasing filter 8 begins at 5 MHz.

The analog detection signal is converted with the analog-to-digital converter 9 at a sampling frequency of 10 MS/s into a digitized signal with a word size of 18 bit. In order to reduce the data rate for the transmission route 10, decimation of the digitized detection signal is carried out. For this purpose, a decimation filter 11 that has a filter portion 12 and a decimation stage 13 is provided. It is the aim to reduce the sampling frequency to 5 MS/s.

Figure 2:
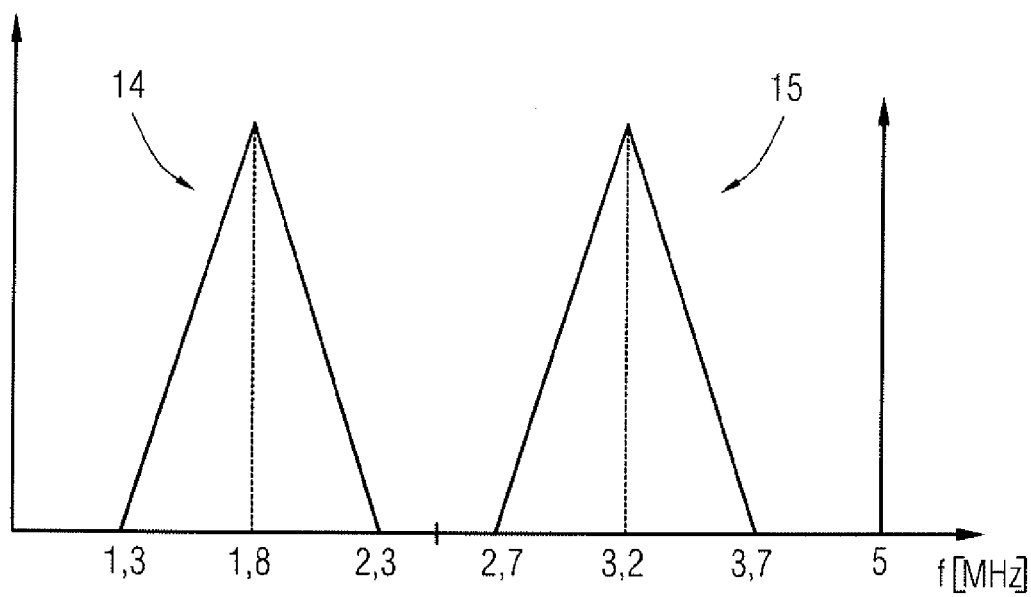
FIG. 2 shows, in one example, the position of the useful signal band and of the aliasing bands during decimation.
Figure 3:
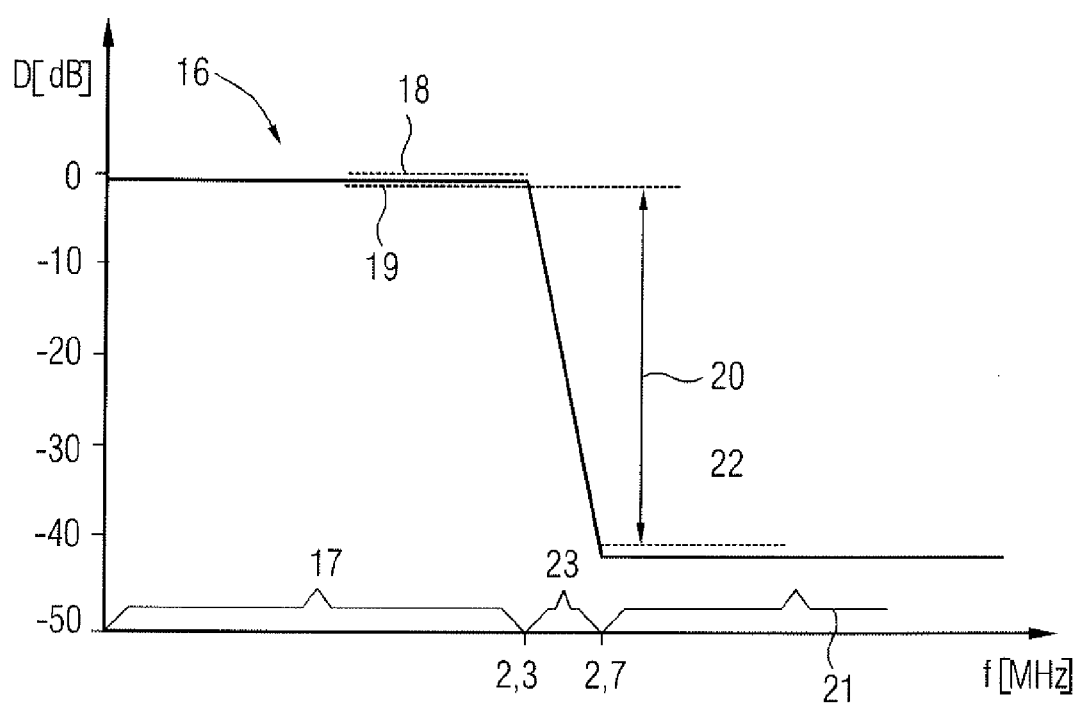
FIG. 3 shows a representation of the example requirements placed on the frequency response of a decimation filter according to the prior art.

FIG. 2 shows, alongside the useful signal region 14 at 1.8+/−0.5 MHz, the closest aliasing band 15 at 3.2 MHz+/−0.5 MHz. Only the region between 2.3 MHz and 2.7 MHz is available for the transition region between the pass band and the stop band of the filter portion 12 of the decimation filter 11. In order to prevent the loss of information without taking into account the presented embodiments, the frequency response 16 shown in FIG. 3 is used. In order to prevent corruption of the signal, the pass band 17 extends up to 2.3 MHz, but at least in the useful signal region, only a very small ripple content may exist in the frequency response 16. A maximum ripple of 1 dB (e.g., +/−0.5 dB) may exist (e.g., indicated by the limits 18 and 19). A further requirement involves roll-off, which is the minimum filter damping difference 20 between the pass band 17 and the stop band 21 beginning at 2.7 MHz. This minimum filter damping difference may be −40 dB. Therefore, in the present example, the damping in the stop region 21 is at least −41 dB, as indicated by the limit 22, which lies 40 dB below the limit 19. In the transition range 23, this difference is overcome, but the small permitted ripple content is maintained. This makes large demands on the filter portion 12 of the decimation filter 11.

In one embodiment, a different frequency response is proposed. The different frequency response places less demands on the decimation filter 11 in that a greater ripple content is allowed in the pass band (e.g., in the useful signal region; a ripple content of 12 dB).

Figure 4:
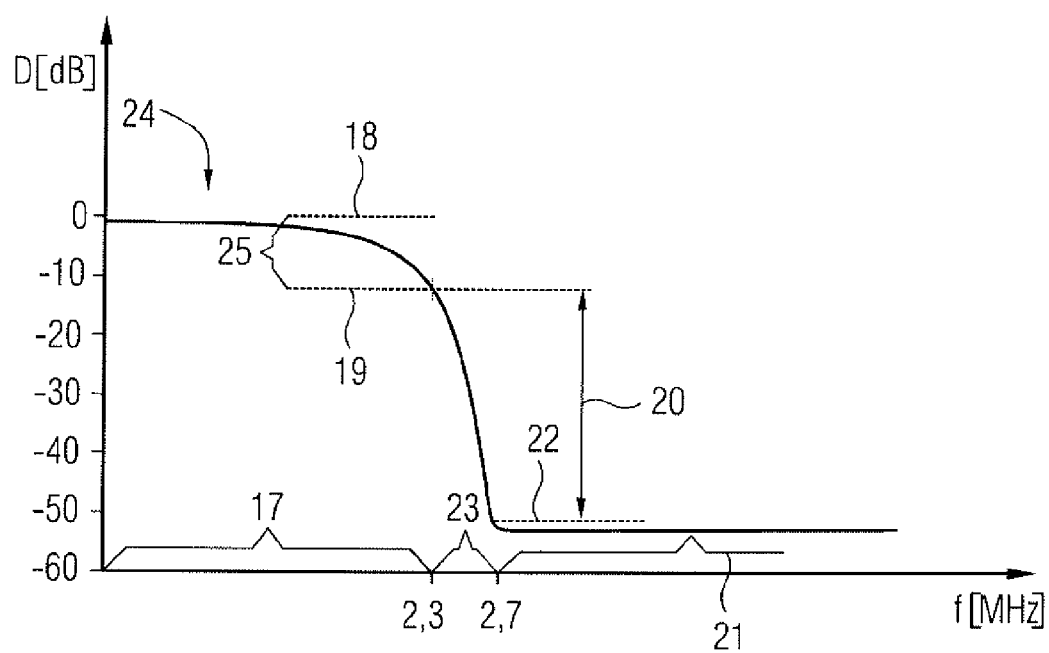
FIG. 4 shows an exemplary frequency response of a decimation filter.

FIG. 4 shows a frequency response 24 of the decimation filter 11 provided in the arrangement 1. The limits 18, 19 have been broadened in that the limit 19 lies at −12 dB. The result of this, if the requirement of the minimum filter damping difference 20 is to be maintained, is a limit 22 that lies at −52 dB.

The greater ripple content 25 allowed in the pass band is used to create a less sharp transition to the stop band 21. Although the damping is therefore still higher in the useful signal region (e.g., below 2.3 MHz), this does not yet apply to the actual transition region 23. In an embodiment, the allowed increased ripple content 25 is used so that the damping of −12 dB, and therefore the lower limit 19, is reached at precisely 2.3 MHz. The abrupt transition from the flat pass band 17 to the steep transition region 23 has been made less severe by this expansion of the tolerance region from 1 dB to 12 dB. Although the demands placed on the transition region 23 (e.g., minimum filter damping difference 20) remain, the practical realization of the decimation filter 11 results in a significant saving of resources and power requirements. For example, with the severe frequency response 24, the decimation filter 11 may be realized with a 22nd-order FIR equi-ripple filter. The nominal ripple content of the filter 11 is 0.5 dB, and the nominal pass band of the filter 11 ends at 1.8 MHz. The nominal stop band of the filter 11 begins at 2.7 MHz with a damping of −55 dB. For use as the decimation filter 11, the pass band 17 is extended to 2.3 MHz, so that a resultant ripple content 25 of 12 dB results.

In another embodiment, the increased permitted tolerance region is used. The increased permitted ripple content is used in another way in that larger variations exist in the pass band 17.

Figure 5:
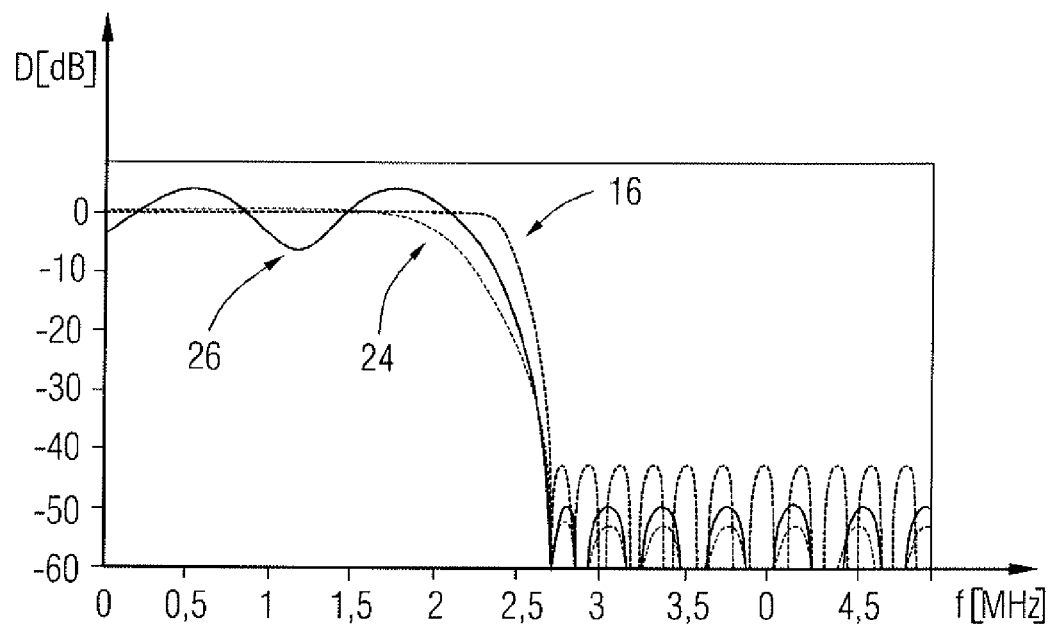
FIG. 5 shows a comparison of possible frequency responses.

FIG. 5 shows, as an example, the frequency response 24 and the frequency response 16 including the ripple content occurring in the stop band 21 in comparison with a further possible frequency response 26, which is characterized by having a sinusoidal shape in the pass band 17.

In another embodiment, the deviations arising from the permitted greater ripple content 25 are to be corrected again with an equalizing filter 27 that is connected downstream of the transmission route 10. The equalizing filter 27 has the inverse of the frequency response of the filter portion 12 of the decimation filter 11, at least in the useful signal region. Since the equalizing filter 27 within the evaluating device 4 is therefore arranged removed from the detection coil 2, larger components may be used from the standpoint of structural size and power requirements (e.g., FPGAs). Therefore, the decimation filter function is divided into the decimation filter 11 and the correcting equalizing filter 27, which makes it possible to reduce the demands and therefore the component and power requirements (e.g., placed on the detection coil 2, but do not have to accept any compromises in the signal quality of the equalizing filter).

As the embodiment represented by FIG. 4 shows, the dynamic range of the decimated signal increases similarly to the expansion of the tolerance region through the increase in the permitted ripple content 25. In the example of FIG. 4, the dynamic range therefore increases by 12 dB, so that, in order to be able to reproduce the dynamic range entirely, the word size is increased to 20 bits, as shown in FIG. 1.

Following the decimation, the decimated detection signal is passed to a serializer 28 in order to be transmitted as a serial data stream by a transmitter 29 via the transmission route 10 to a receiver 30 of the evaluating device 4. There, the signal is parallelized again by a deserializer 31 and is passed through the equalizing filter 27, after which the signal (see the arrow 32) may be further processed by further DSP components.

In other embodiments, the transmission route 10 includes a radio route, an optical waveguide and/or a transmission wire. The data rate is significantly reduced, as compared with an embodiment without decimation, in the present case from a sampling rate per channel of 180 Mbit/s (e.g., 10 MS/s sampling rate at a word size of 18 bits) to 100 Mbit/s (e.g., 5 MS/s sampling rate at a word size of 20 bits).

FIG. 6 shows one embodiment of a magnetic resonance device 33. The magnetic resonance device 33 includes, for example, an arrangement 1 that is, for example, partially realized in the local coil 3.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An arrangement for converting an analog detection signal of a magnetic resonance detection coil into a digital detection signal and for transmitting the digital detection signal to an evaluating device, the arrangement comprising:
   a detection coil comprising:
      an analog-to-digital converter operable to digitize the analog detection signal at a first sampling frequency; and
      a decimation filter operable to decimate the digitized detection signal to a second sampling frequency, wherein the decimation filter comprises a filter portion with a frequency response having a ripple content greater than 1 dB in a pass region associated with a signal of the digitized detection signal;
   a transmission route operable to carry the digitized detection signal to the evaluating device; and
   an equalizing filter following the transmission route, the equalizing filter having a frequency response that corresponds to an inverse of the filter portion frequency response in at least the pass region associated with the signal.

2. The arrangement of claim 1, wherein the ripple content in the pass region is greater than 5 dB.

3. The arrangement of claim 2, wherein the ripple content in the pass region is greater than 12 dB.

4. The arrangement of claim 1, further comprising a mixer operable to mix the analog detection signal with a local oscillator frequency, the mixer being connected upstream of the analog-to-digital converter such that the signal input to the analog-to-digital converter is at an intermediate frequency.

5. The arrangement of claim 4, wherein a mirror filter is connected upstream of the mixer, an anti-aliasing filter is connected downstream of the mixer, or the mirror filter is connected upstream of the mixer and the anti-aliasing filter is connected downstream of the mixer.

6. The arrangement of claim 1, wherein the transmission route comprises a radio link, an optical waveguide, a transmission conductor line, or a combination thereof.

7. The arrangement of claim 1, further comprising:
   a serializer connected upstream of the transmission route; and
   a deserializer connected downstream of the transmission route.

8. The arrangement of claim 2, further comprising a mixer operable to mix the analog detection signal with a local oscillator frequency, the mixer being connected upstream of the analog-to-digital converter such that the signal input to the analog-to-digital converter is at an intermediate frequency.

9. The arrangement of claim 8, wherein a mirror filter is connected upstream of the mixer, an anti-aliasing filter is connected downstream of the mixer, or the mirror filter is connected upstream of the mixer and the anti-aliasing filter is connected downstream of the mixer.

10. The arrangement of claim 3, wherein the transmission route comprises a radio link, an optical waveguide, a transmission conductor line, or a combination thereof.

11. The arrangement of claim 4, wherein the transmission route comprises a radio link, an optical waveguide, a transmission conductor line, or a combination thereof.

12. The arrangement of claim 3, further comprising:
   a serializer connected upstream of the transmission route; and
   a deserializer connected downstream of the transmission route.

13. A magnetic resonance device comprising:
an arrangement for converting an analog detection signal of a magnetic resonance detection coil into a digital detection signal and for transmitting the digital detection signal to an evaluating device, the arrangement comprising:
   a detection coil comprising:
      an analog-to-digital converter operable to digitize the analog detection signal at a first sampling frequency; and
      a decimation filter operable to decimate the digitized detection signal to a second sampling frequency, wherein the decimation filter comprises a filter portion with a frequency response having a ripple content greater than 1 dB in a pass region associated with a signal of the digitized detection signal;
   a transmission route operable to carry the digitized detection signal to the evaluating device; and
   an equalizing filter following the transmission route, the equalizing filter having a frequency response that corresponds to an inverse of the filter portion frequency response in at least the pass region associated with the signal.

14. The magnetic resonance device as claimed in claim 13, wherein the detection coil is a local coil.

15. A method for converting an analog detection signal of a magnetic resonance detection coil into a digital detection signal and for transmitting the digital detection signal, the method comprising:
   digitizing, with an analog-to-digital converter, the analog detection signal at a first sampling frequency;
   decimating the digitized detection signal to a second sampling frequency, wherein the decimating has a frequency response with a ripple content greater than 1 dB in a pass region associated with a signal of the digitized detection signal;
   transmitting the decimated digitized detection signal to an evaluation device,
   equalizing the decimated digitized detection signal following the transmitting, the equalizing having a frequency response that corresponds to an inverse of the decimating frequency response in at least the pass region associated with the signal.

16. The method of claim 15, further comprising increasing a damping in a stop band according to an increase in the ripple content to obtain a pre-defined minimum filter damping difference between a pass band and the stop band.

17. The method of claim 16, wherein the pre-defined minimum filter damping difference is 40 dB.

18. The method of claim 16, further comprising increasing a word size of the decimated detection signal according to an increase in a dynamic range of the frequency response as compared with a word size of the digitized detection signal.

19. The method of claim 18, wherein the word size is increased by 2 bits when the ripple content is 12 dB.

20. The method of claim 15, further comprising serializing the decimated digitized detection signal before transmitting, and deserializing the decimated digitized detection signal after transmitting.

* * * * *